(12) United States Patent
Van De Sanden et al.

(10) Patent No.: US 8,906,596 B2
(45) Date of Patent: Dec. 9, 2014

(54) METHOD OF MARKING A METAL COMPONENT SURFACE WITH MODIFYING SEQUENCES IN WHICH THE SEGMENTS OF THE MARKINGS ARE FORMED

(75) Inventors: John Van De Sanden, Nieuwegein (NL); Hendrik Johannes Krock, Sleeuwijk (NL); Hendrik Anne Mol, Sleeuwijk (NL)

(73) Assignee: Aktiebolaget SKF, Gothenburg (SE)

( * ) Notice: Subject to any disclaimer, the term of this patent is extended or adjusted under 35 U.S.C. 154(b) by 307 days.

(21) Appl. No.: 13/517,470

(22) PCT Filed: Feb. 19, 2010

(86) PCT No.: PCT/EP2010/001054
§ 371 (c)(1),
(2), (4) Date: Aug. 24, 2012

(87) PCT Pub. No.: WO2011/076294
PCT Pub. Date: Jun. 30, 2011

(65) Prior Publication Data
US 2012/0312792 A1   Dec. 13, 2012

(30) Foreign Application Priority Data

Dec. 22, 2009  (WO) .................. PCT/EP2009/009209
Dec. 22, 2009  (WO) .................. PCT/EP2009/009210

(51) Int. Cl.
| B23K 26/36 | (2014.01) |
| G03F 7/20 | (2006.01) |
| B23K 26/00 | (2014.01) |
| B41J 3/413 | (2006.01) |
| B41M 5/26 | (2006.01) |
| B44B 3/02 | (2006.01) |
| B44C 1/22 | (2006.01) |

(52) U.S. Cl.
CPC .............. *B23K 26/36* (2013.01); *G03F 7/2053* (2013.01); *B23K 26/365* (2013.01); *B23K 26/0084* (2013.01); *B41J 3/413* (2013.01); *B41M 5/262* (2013.01); *B44B 3/02* (2013.01); *B44C 1/228* (2013.01)
USPC ........ 430/320; 430/323; 430/331; 219/121.69

(58) Field of Classification Search
CPC .............................. G03F 7/2053; B23K 26/365
USPC ................ 430/269–331; 219/121.68, 121.69; 235/494; 358/3.28
See application file for complete search history.

(56) References Cited

U.S. PATENT DOCUMENTS

| 1,533,239 | A | | 4/1925 | Eschholz |
| 5,343,031 | A | * | 8/1994 | Yoshida ..................... 235/494 |
| 6,261,918 | B1 | * | 7/2001 | So ................................. 438/401 |
| 7,529,636 | B1 | * | 5/2009 | Cato ............................ 702/127 |
| 2008/0153698 | A1 | | 6/2008 | Kawahara et al. |

FOREIGN PATENT DOCUMENTS

| DE | 19710623 A1 | 11/1997 |
| DE | 10159521 A1 | 6/2003 |
| EP | 1223053 A2 | 7/2002 |
| JP | 2009082960 A | 4/2009 |

\* cited by examiner

*Primary Examiner* — Samuel M Heinrich
(74) *Attorney, Agent, or Firm* — Bryan Peckjian; SKF USA Inc. Patent Department (57) ABSTRACT

The present invention resides in a method of providing a mark on a surface of a metal component, where the mark comprises a symbol (301) representing a first entity of information and the method comprises a step of laser marking, in which a controllable laser beam is used to form the symbol (301) from two or more separate line segments (33 1-334), each line segment (33 1.334) having at least one point of overlap with another line segment. According to the invention, the method further comprises a step of embedding a second entity of information within the mark by modifying a sequence in which the two or more separate line segments (33 1-334) are formed.

16 Claims, 4 Drawing Sheets

METHOD OF MARKING A METAL COMPONENT SURFACE WITH MODIFYING SEQUENCES IN WHICH THE SEGMENTS OF THE MARKINGS ARE FORMED

CROSS-REFERENCE

This application is the U.S. national stage of International Application No. PCT/EP2010/001054 filed on Feb. 19, 2010, which claims priority to PCT/EP2009/009210 filed on Dec. 22, 2009 and PCT/EP2009/009209 filed on Dec. 22, 2009.

TECHNICAL FIELD

The invention relates to a method of providing identification information on a metal component by means of laser marking.

BACKGROUND OF THE INVENTION

Laser marking is commonly used on metal components, and is based on the changes that develop in the material due to localized heating by the laser radiation. Various ways of laser marking may be distinguished. Some are described hereafter. Engraving is the removal of material to a depth of 10 to 50μμτι. The laser is used to create a groove in the material and due to melting and evaporation, material is removed to form the groove. Ablation is the evaporation of material by extremely fast laser pulses. The processed material evaporates and fumes are exhausted to prevent re-deposition. Tempering, also called annealing, is the main method for marking steel components. The heat of the laser tempers the steel which changes reflectivity and/or surface structure, leading to a visible mark.

The laser mark on a component surface generally comprises information such as the manufacturer's name and a product type number or serial number etc. This information identifies the product and the maker, but because it is standard information that may be found on any component of a particular type, the information is easy to replicate by counterfeiters. Counterfeiting is detrimental both for the purchaser of a counterfeit article and for the genuine manufacturer.

Consequently, there is a need for a method of providing metal components with an identification mark which is difficult to copy and which makes the component easy to authenticate.

SUMMARY OF THE INVENTION

The present invention resides in a method of providing a mark on a surface of a metal component, where the mark comprises a symbol representing a first entity of information and the method comprises a step of laser marking, in which a controllable laser beam is used to form the symbol from two or more separate line segments, each line segment having at least one point of overlap with another line segment. According to the invention, the method further comprises a step of embedding a second entity of information within the mark by modifying a sequence in which the two or more separate line segments are formed.

The mark may comprise a single symbol, such as a numeral or a character, or may comprise a plurality of such symbols in the form of e.g. a manufacturer's name or logo or an alphanumeric product code. Thus, the first entity of information may simply consist of the readable information that is conveyed by the one or more symbols of the mark.

The second entity of information corresponds to the sequence that has been used to form the two or more line segments. Each line segment of the symbol is a continuous curve that is formed by activating the laser beam at either a first end of the segment or a second end of the segment. When such a segment is laser-marked on a metal component surface, it is possible to discern at which end of the segment the beam was activated and at which end the beam was deactivated. Consequently it is also possible to discern the direction of beam travel. In the case of overlapping line segments, it is also possible to discern which line segment was formed on top of another, i.e. the sequence of formation can be determined.

Consider the letter "H" as an example. Since the letter consists of three line segments, there are six possible sequences (n!, where n is the number of segments) for creating the letter. It is therefore possible to embed a code, i.e. a second entity of information, within the symbol by assigning a value to each sequence. Suitably, the laser is programmed to form the lines of the letter H using six different sequences and the sequence used is modified depending on which value is to be embedded. When a marked component subsequently needs to be authenticated, the sequence used to form the "H" is identified and decoded. If the wrong sequence has been used, the component is likely to be a counterfeit.

In a further development, the step of embedding further comprises modifying a start point of at least one line segment. Preferably, the step of embedding further information comprises modifying a start point of each line segment. The basic form being modifying a start point (A or B) of a determined segment (A-B), i.e. modifying the direction of travel (A to B or B to A). The advantage of this development is that the number of different ways of forming the symbol is increased. Again using the letter "H" as an example, the laser can be programmed to form this letter in at least 24 (six times four) different ways by modifying not only the sequence (n!=6, n=3 segments) in which each line segment is created, but also by modifying the start point ($2^n$=4, n=3 segments) of each line segment. Increasing the number of variants increases the amount of additional information that can be encoded into a mark and thus also increases the likelihood that a counterfeiter will get it wrong.

In some examples of a mark provided according to the invention, the mark comprises a symbol with two or more overlapping line segments, whereby one of the line segments is a closed loop; for example, the letter "Q". As mentioned, since it is possible to determine the start and stop locations of the laser beam, the direction of beam travel is also discernible. Using the letter "Q" as an example, and assuming a single predetermined start point of the closed loop, the closed loop can be formed by moving the laser beam in a clockwise direction or an anti-clockwise direction. The step of embedding may thus further comprise modifying the direction of formation of the closed loop. Suitably, the start point of the closed loop is also variable.

Counterfeiting may be rendered even more difficult by modifying one or more attributes of the symbol. Thus, in a further embodiment of the inventive method, the step of embedding comprises modifying one or more of:

The shape of a symbol;
The size of a symbol;
The number of segments used to form a symbol;
The length of each segment.

In a still further development, the mark provided in accordance with the invention comprises a plurality of symbols, whereby a second entity of information is embedded within one or more of the symbols. Preferably, a second entity of information is embedded within each symbol. Again, the advantage of this development is that the mark becomes more difficult to copy. Also, a code string may then be embedded within the mark, which can be compared with code strings stored in e.g. a manufacturer's database. Advantageously, the stored code strings may provide additional information about components; for example, the date of manufacture or the manufacturing site. Thus, a mark provided in accordance with the invention not only enables authentication of a component, but can also be used for traceability purposes.

When the mark comprises a plurality of symbols, the step of embedding may additionally comprise modifying one or more of the following attributes of at least one symbol:

The position of the symbol relative to other symbols.
The position can relate to horizontal and/or a vertical displacement relative to other symbols.
The size of the symbol relative to other symbols.

In some examples of a mark provided in accordance with the invention, the mark comprises a symbol that is formed from a single line segment; for example, the letter "C". As will be understood, the step of embedding a second entity of information within the mark may then comprise modifying a start point of the single line segment. The single line segment may also be divided into a plurality of sub-segments that can be varied as to sequence and starting points. Similarly, when a mark comprises a symbol that is formed from a single closed loop, e.g. the numeral "0", the step of embedding information suitably comprises modifying a direction of formation of the closed loop.

Laser marking according to the present invention may be made with various laser types, e.g. solid state lasers (Nd:YAG lasers, fibre lasers) or $CO_2$ lasers. Lasers producing pulses of radiation or, alternatively, continuous wave lasers may be used.

The components marked in accordance with the invention may be any metal component that is capable of being laser-marked. In one example, the component is a bearing component made of hardened bearing steel e.g. a ring of a rolling element bearing.

In a further development of the invention, when the metal component is made of steel or hardened bearing steel, the mark on the component surface is visually undetectable to the human eye. In a first embodiment of this development, the step of laser marking is performed in a protective gas environment, so as to prevent the formation of an oxide layer on the marked component surface. In a second embodiment, the step of laser marking is performed in an oxygen-containing environment and the method further comprises a step of material removal in which at least a visible oxide layer formed on the marked component surface is removed. The advantage of this further development is that counterfeiting becomes even more difficult.

In order to determine whether the component is a genuine component, the visually undetectable mark is rendered optically visible by applying an etchant to the component surface at a location where genuine articles have the mark. If no mark is present, the component is a counterfeit. If a mark is present, the information embedded therein by means of modification of sequence and/or start point and/or direction of beam travel is retrievable after etching. Suitably, the embedded information is then decoded and compared with authentic information.

Embodiments of the invention will now be described, by way of example only, with reference to the accompanying drawings.

BRIEF DESCRIPTION OF THE DRAWINGS

FIGS. 1a-3 show examples of alphanumeric characters marked on a component surface using a pulsed laser beam.

DETAILED DESCRIPTION OF THE INVENTION

Counterfeit products are a problem for genuine manufacturers for a number of reasons. These reasons include loss of sales revenue and loss of reputation, since the counterfeit products are generally of inferior quality. Furthermore, when the counterfeit product is a potentially vital machine component such as e.g. a rolling element bearing, the use of a counterfeit bearing can have serious consequences. The machine may not reach its warrantied or expected life due to early failure of a bearing. Furthermore, bearing failure can result in damage to the machine as a whole and in potentially dangerous situations. Thus, it is important for buyers of bearings that the products they purchase are the genuine article.

Bearings and other metal components are generally laser marked with identification data, such as the manufacturer's name and/or the bearing type number. This data is easy to copy and incorporate on a bearing that has not been made by the purported manufacturer. If the bearing is then purchased and its early failure incurs damage to the purchaser, the purported manufacturer will likely be held liable. It is then important that the purported manufacturer is able to prove that the failed bearing is a counterfeit.

Consequently, there is a need for a method of providing a metal component with identification data that renders the component difficult to copy and easy to authenticate.

The present invention addresses this need by means of embedding a code within a mark that is provided using a controllable laser beam, on a surface of the component. The method of the invention will be described with regard to bearing components, but it is to be understood that the method may be applied to any metal component that is capable of being marked with a laser.

Figure 1A:
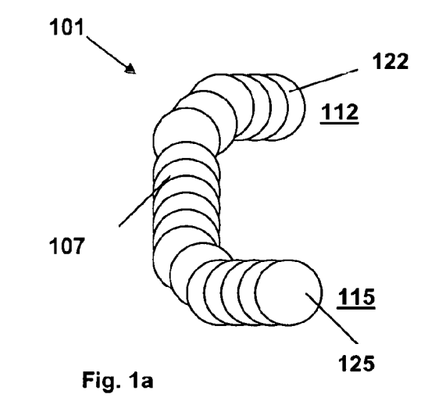
Figure 1B:
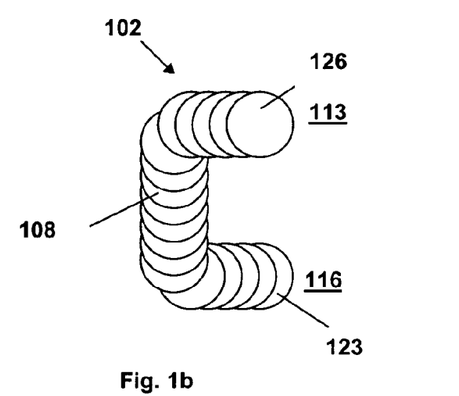

FIGS. 1a and 1b show examples of a mark created on e.g. a side surface of a bearing ring using a laser beam. The bearing ring may be made of hardened bearing steel, titanium or any other suitable metal. The laser may be a Nd:YAG laser, with the following settings:

Power: 25 to 100 W.
Focal diameter: 10 to 50μm
Pulsed laser frequency: 100 to 500 kHz
Mirror accuracy: 50 μm
Speed: 100 to 200 mm/sec In these examples, the mark consists of a single symbol: a first symbol 101 and a second symbol 102, each comprising one line segment 107, 108 formed using a single continuous movement of the laser beam. The first and second symbols represent the letter C.

When focussed on the component surface, each laser pulse of the beam marks a small dot, typically with a diameter of less than 0.1 mm. Therefore, the line segments 107, 108 are formed by a series of overlapping dots. As may be seen in FIG. 1a, the first symbol 101 was created by activating the laser beam at a first end 112 of the "C" and deactivating the laser beam at a second end 115 of the "C". This can be seen because a start dot 122 (start point of the line segment 107), corresponding to a start location of the beam, does not overlap any other dot. Similarly, a stop dot 125 (stop point of the segment 107), corresponding to a stop location of the laser beam, can be identified from the fact that a stop dot 125 is not overlapped by any other dot. In the second symbol 102 of FIG. 1b, the start dot 123 is located at the second end 116 of the "C" and the stop dot 126 is located at the first end 113 of the "C". It is also possible to discern the direction of beam travel from the overlapping dots.

When a symbol consists of single line segment, the laser beam may have one of two predefined start locations: the first end 112, 113 or the second end 115, 116 of the segment. According to one embodiment of the invention, when the mark comprises a symbol formed from a single line segment, a code is embedded within the mark by modifying a start point of the line segment. Suitably, a set of predetermined start points is defined, whereby a different value is assigned to each one. The symbol is then formed using one predetermined start point from the set. In the examples of FIGS. 1a and 1b, the set of predetermined start points has two members, meaning that it is possible to assign one of two values to the start location of the laser beam. Let us assume that a value of 0 is assigned when the "C" begins at the first end 112 (as in FIG. 1a) and that a value of 1 is assigned when the "C" begins at the second end 116 (as in FIG. 1b). Thus, the value 0 is encoded within the first symbol 101 and the value 1 is encoded within the second symbol 102.

Depending on the laser settings, the start point of a line segment may be visible with the naked eye. Otherwise, the start point is discernible with a magnifying glass or other, more powerful, optical instrument. Consequently, the code embedded within the symbol can be read and then decoded.

When a symbol consists of a single line segment that may be formed in one of two ways, the counterfeiter has a 50% chance of selecting the correct variant. Thus in order to render counterfeiting more difficult it is advantageous to increase the number of variants. In a further development, the method comprises modifying one or more attributes of the symbol in addition to the start point. For example, as may be seen from FIGS. 1a and 1b, the first symbol 101 has a different shape from the second symbol 102: the first symbol 101 is more curved in comparison with the second symbol 102. Assuming that the laser has been programmed with two predefined shapes for forming the letter "C", the number of different variants for creating the letter has increased to four. The number of variants can be further increased by increasing the number of predefined shapes and/or by modifying a further attribute of the symbol, which further attribute also has a set of predefined variants: Again as may be seen from FIGS. 1a and 1b, the first symbol 101 is slightly larger than the second symbol 102. Assuming that the laser has been programmed with two predefined sizes and two predefined shapes for forming the letter "C", the number of variants increases to eight (2 variants start/stop, 2 variants shape, and 2 variants size). In other words, three bits of data can be encoded within such a symbol.

Figures 2A, 2B:
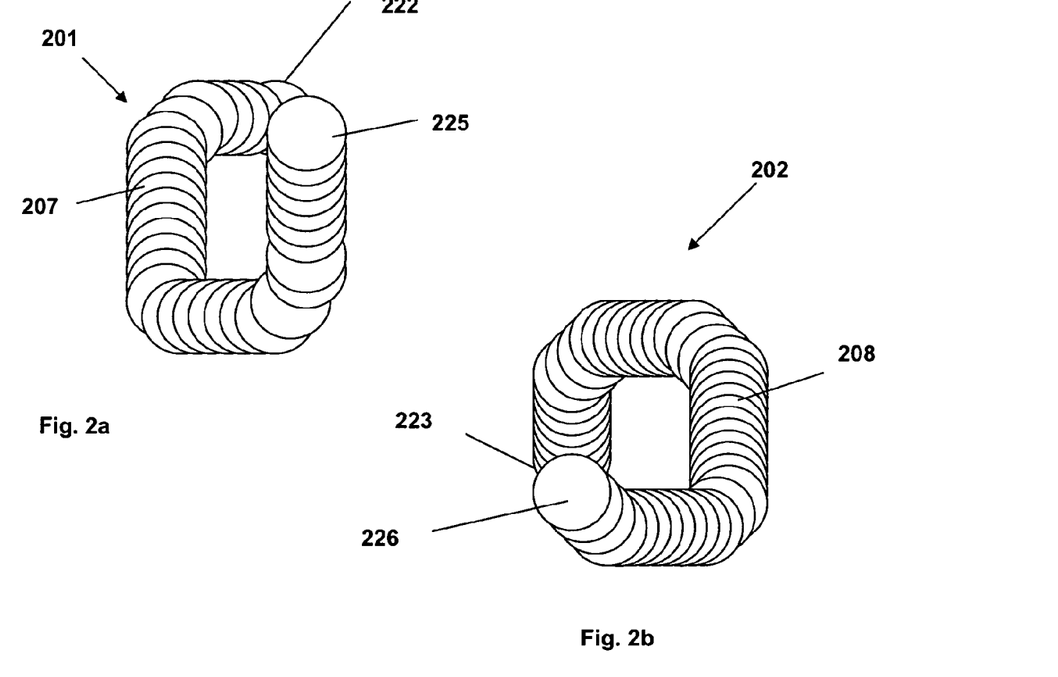

FIG. 2a and FIG. 2b show further examples of a symbol marked on a metal component e.g. a side face of a bearing ring. The laser may be of the same type and have the same settings as previously defined for FIGS. 1a and 1b. The mark again consists of a single symbol which comprises a single line segment formed in a single continuous movement of the laser beam. In these further examples, the line segment 207, 208 is a closed loop. FIG. 2a shows a third symbol 201 and FIG. 2b shows a fourth symbol 202. The third and fourth symbols represent the numeral "0", whereby the closed loop of each "0" is formed by a series of overlapping dots. The start dots 222, 223 and the stop dots 225, 226 of the third and fourth symbols 201, 202 are identifiable in the same way as explained with reference to the first and second symbols 101, 102 of FIGS. 1a and 1b respectively.

As may be seen from FIGS. 2a and 2b, the start dot 222 of the third symbol 201 has a different location on the "0" compared with the start dot 223 of the fourth symbol 202. When a laser-marked symbol comprises a closed loop, the symbol may be created using a direction attribute and more than two predefined start locations of the laser beam. In principle, a large number of different start locations are possible, depending on the accuracy of the laser and the size of the symbol. For the sake of simplicity, let us assume that the laser has been programmed to form a "0" with two possible start locations, corresponding to the locations respectively shown in FIGS. 2a and 2b.

As may also be seen from the direction of the overlapping dots in FIG. 2a and FIG. 2b, the third symbol 201 was formed by moving the laser beam in an anti¬clockwise direction, while the fourth symbol 202 was formed by moving the laser beam in an anti-clockwise direction. As can also be seen, the "0" of FIG. 2a has a slightly different shape than the "0" of FIG. 2b. Consequently, the numeral "0" may be formed in eight different ways in this example, by varying not only the start point of the closed loop between two different positions, and the shape of the "0", but also by varying the direction in which the closed loop is formed. As mentioned, the laser may be programmed to form the numeral "0" using several predefined start locations of the laser beam. In a further embodiment of the inventive method, a single start location may be defined for a closed loop, whereby the direction of movement of the laser beam is variable in order to embed a code within the symbol. Furthermore, as explained with reference to the first and second symbols 101, 102 of FIGS. 1a, 1b, additional attributes of the numeral "0", such as size, may be varied in order to increase the number of variants for creating the numeral, and thereby increase the number of different values that can be encoded with the symbol/numeral.

Figure 3:
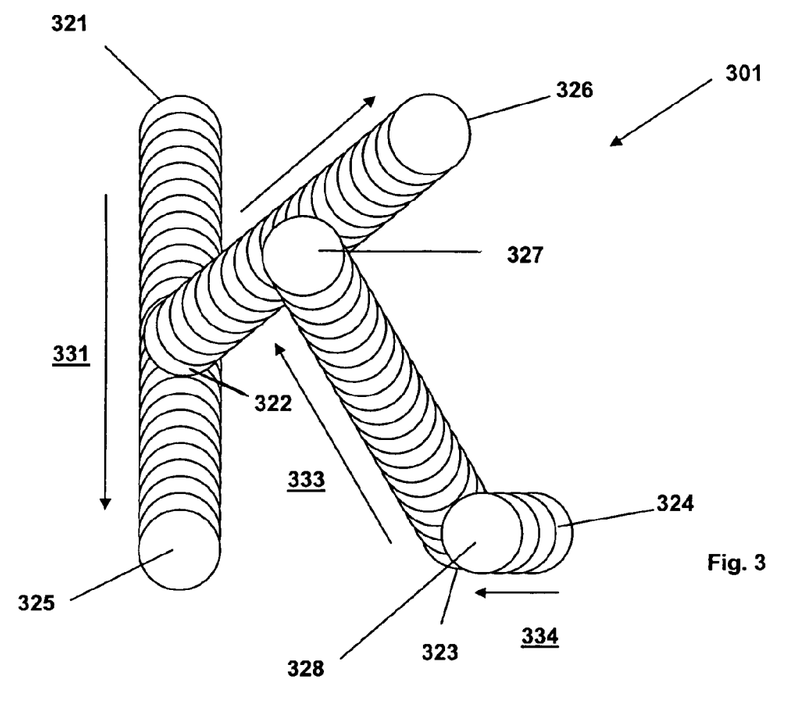

FIG. 3 shows a still further example of a mark formed on a surface of a metal component using the laser described with reference to FIGS. 1a and 1b. The metal component can be a flanged bearing ring, whereby the flange part is made of aluminium and is provided on an outer circumference with the mark. The mark consists of a fifth symbol 301 which comprises a plurality of overlapping line segments. In this example, the fifth symbol 301 represents the letter "K" and was formed using four lines segments 331, 332, 333, 334, each line segment comprising a series of overlapping dots.

As described previously, the start dots 321, 322, 323, 324 and the stop dots 325, 326, 327, 328 of each respective line segment 331, 332, 333, 334 are discernible, whereby each line was formed in the direction indicated by the corresponding arrow. Furthermore, it can be seen that the fourth line segment 334 of the "K" overlaps the third line segment 333 of the "K", which third line segment overlaps the second line segment 332 of the "K", which second line segment overlaps the first line segment 331 of the "K". In other words, the first line segment 331 was formed first, followed by the second line segment 332, followed by the third line segment 333, followed by the fourth line segment 334.

Consequently, when a symbol comprises two or more line segments which overlap each other, the sequence in which the line segments were laser-marked is discernible. According to a further embodiment of the invention, a set of predetermined sequences is defined, whereby a different value is assigned to each predetermined sequence, and one predetermined sequence from the set is used to form the symbol comprising overlapping line segments. In other words, the sequence is modified in order to embed a code, a second entity of information, within the symbol, which represents a first entity of information. The number of possible sequences is n!, where n=number of different overlapping segments used.

With reference to the fifth symbol 301 consisting of four line segments 331, 332, 333, 334, each of which intersects with at least one other line segment, twenty-four different sequences (n!, where n=number of segments) may be used to form the "K". Correspondingly, one of twenty-four different values can be encrypted within the symbol by creating each line segment in a predetermined sequence. In addition, each line segment has a first end and a second end and the start location of the laser beam can be either the first end or the second end to change the direction of making a segment. By varying the direction of creating each line segment 331, 332, 333, 334, the number of different values that can be encrypted within the fifth symbol 301 increases by sixteen times ($2^n$, where n=number of segments) giving a total of 384 (4! times $2^4$) different values. Again, this number can be further increased by programming the laser to create the letter "K" using one of several different shapes, one of several different sizes and varying the position of each first and second end of a segment. Needless to say, the laser need not be programmed with every possible variant within a set of variables.

As will also be understood, an identification mark that is encrypted with data in accordance with the invention may comprise more than one laser-marked symbol.

For example, the mark may be a character string such as "MADE IN GERMANY" or an alphanumeric code such "AK 89449". When the mark comprises several symbols, a relative spacing between the symbols is a further attribute of the mark that can be modified in order to embed a code within the mark, by assigning a different value to each relative spacing in a set of predetermined spacings. A shift of the symbols relative each other in a vertical direction is an additional manner of adding attributes.

In a still further example, the mark itself may be an encryption. For example, the mark may be a barcode, whereby a first layer of encryption lies in a spacing between the lines which make up the barcode and a second layer of encryption lies in the direction in which each line was formed. As explained before, one of two different values can be encrypted within each line depending on the start location of the line: at the first end or the second end, i.e. by selecting the direction in which the line is made. Thus, by making the start point of each line modifiable, the barcode further comprises a binary code. Further information can be encrypted by varying the absolute position of the start and the end point. One way can be seen as a shift of the position of the line, both the start and the stop are shifted by the same amount. Another way can be by varying the length of each line, by shifting the position of the start and/or the end.

Thus far, the different embodiments of the invention have been described with reference to a mark created using a pulsed laser beam. The one or more symbols are formed from lines comprising a series of overlapping dots, which enables identification of the start and stop locations of each line. The method of the invention may also be implemented using a continuous wave laser.

Figure 4:
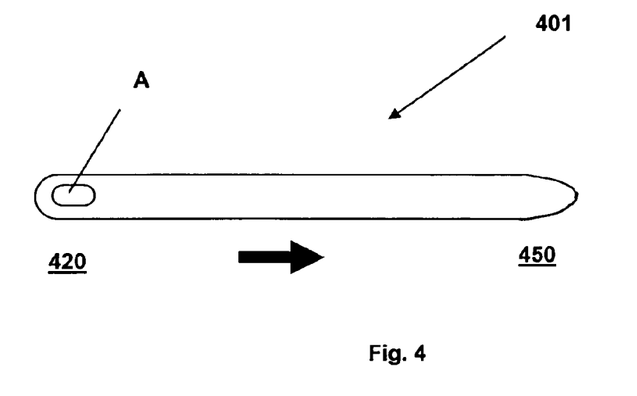
FIG. 4 shows an example of a line marked on a steel component surface using a continuous wave laser beam.

FIG. 4 shows a line segment that has been created on a surface of a metal component using a continuous wave laser, for example: a CW fiber laser. The line segment 401 was formed by activating the laser beam at a start point 420 on the component surface and then moving the laser beam in the direction indicated by the arrow. When the CW laser is activated, the beam is held at the start location 420, for a brief period, until the metal surface has reached a temperature sufficient to perform the desired form of marking (e.g. annealing). The holding time may be sufficient to cause localized melting of the metal at the start location, indicated by a melted zone A in the form of a visible crater. Thus, when present, this crater characterizes the start point 420 of the line 401. During marking, the laser beam is moved to an end point 450 of the line segment 401, where the beam is deactivated. As may be seen, the end 450 of the line segment is characterized by a "fade-out area" where the line segment tapers towards a point, while the start 420 of the line segment is more rounded. Consequently, it is possible to distinguish between the start and end points of the line segment 401, even when a melted zone A (and visible crater) is not present, and thereby determine the direction in which the beam travelled. Depending on the material and the laser settings, the start/stop locations may be visible with the naked eye. Otherwise, optical instruments providing suitable magnification will reveal this data.

A continuous wave laser may also be used in the embodiment described with reference to FIG. 3, whereby a predefined sequence is used to form a symbol that comprises overlapping lines.

The method of the invention may be used on any metal component that is capable of being marked using a laser beam; for example, components made of aluminium or titanium or steel. The method is particularly advantageous in combination with steel components, especially components made of hardened bearing steel, due to the microstructural changes that occur in response to heat. In effect, the laser beam heat-treats the steel surface and an underlying region. The advantage of this is that even if the mark provided in accordance with the invention gets worn or rubbed off, so as to be visually undetectable with the naked eye, the mark and the code embedded therein can still be retrieved.

Figure 5A:
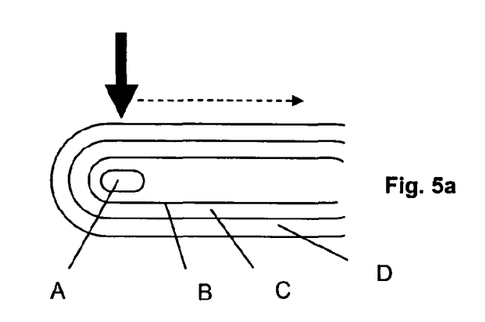
FIG. 5a shows schematic plan view of part of the line of FIG. 4, including heat-affected zones induced by the laser beam.
Figure 5B:
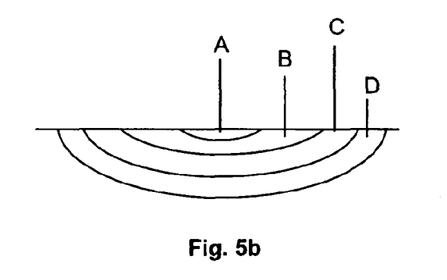
FIG. 5b is a schematic cross-section of the same marked component surface.

Laser beam marking of a component made of steel generally creates a visible mark on the surface of the component, due to the formation of an oxide layer. Furthermore, the laser marking produces one or more heat affected zones at the surface and in the underlying material. As mentioned, the microstructure of steel changes when it is heated, and several zones may be distinguishable, according to the temperatures they have reached. The heat affected zones created will be described, by way of example, in relation to a line made on a surface of a bearing component that has undergone a hardening treatment, the line being formed using a CW fiber laser. FIG. 5a and FIG. 5b respectively show a top view and a cross-sectional view of the heat affected zones created.

At the centre of the mark, temperatures may have been high enough (for example, above 1500° C.) to melt the steel locally. This is called the melted zone, which after cooling of the bearing component, may become a re-hardened zone, comprising martensite. This is a very hard phase in which most of the alloy elements are dissolved. It is called herein zone A.

A hardened zone may be present directly outside the melted zone, which after cooling of the bearing component, may become a re-hardened zone called an over-austenitised zone. This zone was not melted but most of the alloy elements therein are dissolved. It may have undergone temperatures between 800 and 1500° C. It is called herein zone B.

After this latter zone, an intermediate zone may be present, called a re-austenitised zone which may comprise remaining carbides. It is called herein zone C. A portion of this zone may also be considered as a re-hardened region after cooling of the bearing component.

Finally, at the periphery of the mark, a tempered zone may be present comprising carbide precipitates. It is called herein zone D. In this zone, the temperature of the steel may have reached between 200 and 500° C.

In addition, an oxide layer forms at the surface heated by the laser. This layer generally appears dark, due to the reflection of the light in all directions and the oxidised surface, and typically has a thickness of a few microns. After removal of the oxide layer by means of e.g. polishing, the different heat-affected zones created by a laser mark may be easily seen by exposing the mark to a suitable etchant, for example: a solution of nitric acid and ethanol (Nital). The etchant attacks the interfaces between the small precipitates and the steel matrix and attacks the different phases in the steel at different rates. When etched, zone A may become white, zone B white and grey and zone D dark.

Figure 5C:
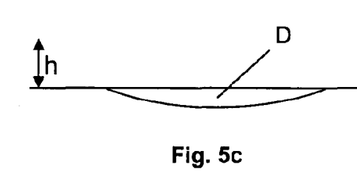
FIG. 5c is a schematic cross-section of the same marked component surface, rendered visually undetectable after a material removal step.

Thus, an "invisible" line segment, symbol or entire mark can be made visible. The code embedded there within is also retrievable. With reference now to FIG. 5c, let us assume that an amount of material h is removed from the bearing surface, such that the line only comprises the tempered zone D. As mentioned, a laser beam is generally held for a brief period at the start point of a line or symbol, before the beam is moved. This means that more energy is imparted to the start point than to parts of the line created while the beam was moving. In effect, the start point has undergone more tempering, whereby more entrapped carbon will diffuse and precipitate as carbides. When an etchant is applied to the line/symbol, the resulting microstructural difference is revealed and thus, the start point is identifiable. An embedded code based on modifying the start point of lines can then be decoded, assuming that the value assigned thereto is known.

Similarly, points of overlap within a symbol comprising a closed loop and/or two or more intersecting lines are discernible, since the points of overlap have experienced more localised heating than non-overlapping parts of the symbol. Thus, it is also possible to decode an embedded code based on modifying the sequence in which overlapping lines of a symbol are created. Direction of beam travel and the size and shape of symbols also remain discernable, meaning that if any of these attributes have been modified in order to embed a code within a symbol, decoding is possible.

Thus, in a further embodiment, a steel component is provided with a mark according to the method of the invention, whereby the mark is visually undetectable with the naked eye. In one example of this embodiment, the mark is rendered visually undetectable by removing at least the oxide layer that forms on the component surface during the laser marking. The layer may be removed by means of e.g. polishing using an abrasive cloth or by means of a suitable machining process. As explained above, the sub-surface changes in the steel microstructure induced by thermal energy from the laser beam become optically visible when an etchant is applied to the surface where the mark is present.

In an alternative example of the further embodiment, the step of laser marking is performed in a protective gas environment such that the formation of an oxide layer is prevented. The identification mark thus created is not visually detectable, making a step of material removal unnecessary. Again, the mark is revealable by applying an etchant to the surface where the mark is present.

The code embedded within the revealed mark can then be decoded, to enable authentication of the steel component. As will be understood, the component may be provided with one or more visible marks according to the invention and/or one or more invisible marks according to the invention. A set of predetermined relative spacings may thus be defined, whereby a different value is assigned to each predetermined spacing between e.g. a first invisible character string and a second visible numerical code. Consequently, it is also possible to embed a code based on modification of the relative spacing between identification marks.

Figure 6:
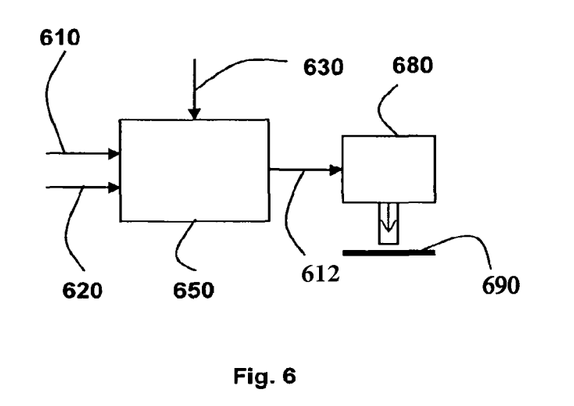
FIG. 6 illustrates a schematic diagram of encoding a second entity of information into a first entity of information.

FIG. 6 illustrates a typical embodiment and application of the invention. An encoder 650 receives a first information entity 610, a second information entity 620, and a set of rules 630 that can be used to encode the second information entity 620 into the first information entity 610. These rules 630 are for example: sequence of segment formation, size, shape, direction of the segments, starting/stopping positions, location of a symbol, relative interrelated location of symbols. The encoder 650 determines how the one or more segments of each symbol must be formed in order to encode the second information entity 620 into the first entity of information 610, and transfers a corresponding set of instructions 612 to the laser 680. The laser 680 will in turn mark a metal component 690 with one or more symbols corresponding to the encoded first information entity. Depending on for example the size of an area of the metal component 690 onto which a mark comprising one or more symbols is to be placed, it may be possible to use only a selection of the rules 630. It is of course advantageous to use as many different rules 630 as possible, thus enabling more information to be encoded into each symbol. If the second information entity 620 is not able to be encoded into the corresponding symbols of the first information entity 610, possibly due to a restriction of available encoding rules 630, then one or more padding symbols can be added, such as a purely graphical symbol or for example one or more innocent looking string of symbols such as the characters "SKF".

Figure 7:
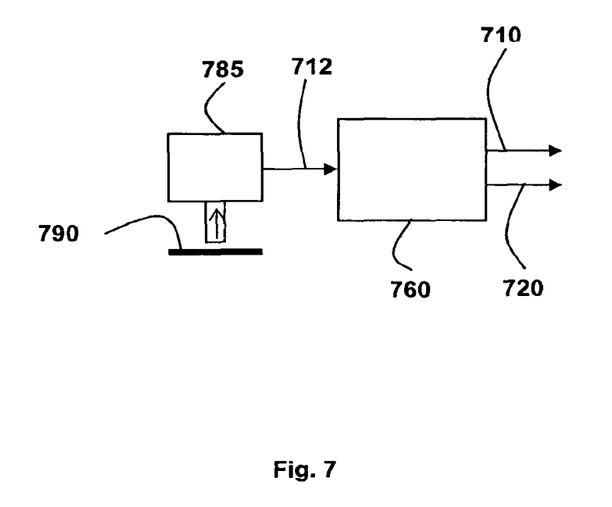
FIG. 7 illustrates a schematic diagram of decoding the first and second entities of information.

A marked metal component can be decoded manually, semi-automatically or automatically. FIG. 7 illustrates a typical set-up of how to automatically decode the first and second information entities. A camera 785 or other device will initially detect a mark with one or more symbols on a metal component 790 and suitably transform this into an information stream 712 that corresponds to the encoded first information entity. The information stream 712 is then decoded by a decoder 760 which will generate the first information entity 710 and the second information entity 720. Alternatively the decoder 760 could be initiated with the first information entity to thereby simplify the decoding. The decoder could even be initiated with both the first and the second information entities, then only giving an indication if there is a match or not.

A number of aspects/embodiments of the invention have been described. It is to be understood that each aspect/embodiment/feature may be combined with any other aspect/embodiment/feature. The invention may thus be varied within the scope of the accompanying patent claims.

The invention claimed is:
1. A method of providing a mark on a surface of a metal component, the mark comprising a symbol representing a first entity of information,
   the method comprising a step of laser marking, wherein a controllable laser beam is used to form the symbol from two or more separate line segments, each line segment having at least one point of overlap with another line segment, and wherein the method further comprises a step of embedding a second entity of information within the mark by modifying a sequence in which the two or more separate line segments are formed.

2. The method according to claim 1, wherein the step of embedding further comprises modifying a start point of at least one separate line segment, the start point corresponding to a start location of the laser beam.

3. The method according to claim 1, wherein the step of embedding further comprises modifying a start point of each separate line segment.

4. The method according to claim 1, wherein the symbol further comprises a line segment in the form of a closed loop, and the step of embedding further comprises modifying a direction of formation of the closed loop, corresponding to a direction of travel of the laser beam.

5. The method according to claim 1, wherein the step of embedding further comprises modifying the number of separate line segments used to create the symbol.

6. The method according to claim 1, wherein the step of embedding further comprises modifying at least one dimension of the symbol and/or a shape of the symbol.

7. The method according to claim 1, wherein the mark further comprises a plurality of symbols.

8. The method according to claim 7, wherein the mark further comprises a symbol consisting of a single line segment and the step of embedding further comprises modifying a start point of the single line segment.

9. The method according to claim 8, wherein the single line segment is formed by a closed loop and the step of embedding further comprises modifying a direction of formation of the closed loop, corresponding to a direction of travel of the laser beam.

10. The method according to claim 7, wherein the step of embedding further comprises modifying at least one of:
   a position of one symbol relative to another, the position defining a relative displacement in horizontal and/or vertical direction;
   a size of one symbol relative to another.

11. The method according to claim 1, wherein the metal component is further comprises steel or hardened bearing steel.

12. The method according to claim 11, wherein the mark is visually undetectable to the human eye.

13. The method according to claim 12, wherein the step of laser marking is performed in a protective gas environment, so as to prevent the formation of an oxide layer on the marked component surface.

14. The method according to claim 12, wherein the step of laser marking is performed in an oxygen-containing environment and wherein the method further comprises a step of material removal in which at least a visible oxide layer formed on the marked component surface is removed.

15. The method of authenticating a metal component according to claim 13, the method comprising steps of:
   decoding the second entity of information embedded within the mark;
   comparing the decoded information with authentic information.

16. The method of authenticating according to claim 15, wherein the metal component is a bearing having a mark, the method further comprising a step of:
   rendering the visually undetectable mark optically readable, by applying an etchant to the surface of the component where the mark is present.

* * * * *